US012259409B1

(12) United States Patent
Tsironis

(10) Patent No.: US 12,259,409 B1
(45) Date of Patent: Mar. 25, 2025

(54) HARMONIC LOAD PULL TUNER

(71) Applicant: Christos Tsironis, St-Laurent (CA)

(72) Inventor: Christos Tsironis, Kirkland (CA)

(*) Notice: Subject to any disclaimer, the term of this patent is extended or adjusted under 35 U.S.C. 154(b) by 205 days.

(21) Appl. No.: 18/113,850

(22) Filed: Feb. 24, 2023

(51) Int. Cl.
G01R 15/16 (2006.01)
G01R 27/32 (2006.01)

(52) U.S. Cl.
CPC ............ G01R 15/16 (2013.01); G01R 27/32 (2013.01)

(58) Field of Classification Search
CPC ................................ G01R 15/16; G01R 27/32
USPC ..................................... 324/126, 76.11, 76.51
See application file for complete search history.

(56) References Cited

U.S. PATENT DOCUMENTS

| | | | |
|---|---|---|---|
| 5,910,754 A | 6/1999 | Simpson et al. | |
| 6,674,293 B1 | 1/2004 | Tsironis | |
| 7,595,709 B1 | 9/2009 | Boulerne | |
| 8,854,162 B1 | 10/2014 | Tsironis | |
| 9,257,963 B1 | 2/2016 | Tsironis | |
| 9,625,556 B1 | 4/2017 | Tsironis | |
| 11,327,101 B1 | 5/2022 | Tsironis | |
| 11,867,736 B1 * | 1/2024 | Tsironis | G01R 31/2822 |
| 11,879,920 B1 * | 1/2024 | Tsironis | G01R 27/32 |
| 11,879,921 B1 * | 1/2024 | Tsironis | G01R 27/32 |

OTHER PUBLICATIONS

"Load Pull Measurements" [online], Wikipedia [retrieved on Nov. 18, 2016] Retrieved from Internet <URL:http://en.wikipedia.org/wiki/Load_pull>.
"Computer Controlled Microwave Tuner", Product Note 41, Focus Microwaves, Jan. 1998.
"Linear Actuator" [online], Wikipedia [retrieved on Apr. 25, 2020] Retrieved from Internet <URL: https://en.wikipedia.org/wiki/Linear_actuator>.
"Lecture 20: Transmission (ABCD) Matrix" [online], EE 481/581—Microwave Engineering, Course Syllabus [retrieved on Jul. 13, 2015] Retrieved from Internet <URL: http://whites.sdsmt.edu/classes/ee481/notes/481Lecture20>.

* cited by examiner

Primary Examiner — Giovanni Astacio-Oquendo

(57) ABSTRACT

A low profile four probe harmonic load-pull slide screw impedance tuner uses four tuning probes sharing the same slabline; they are inserted in pairs diametrically at fixed depth (distance from the center conductor) from both sides into the channel and move only horizontally along the slabline. The tuner does not have adjustable vertical axes controlling the penetration of the tuning probes and its low profile is optimal for on-wafer operations with direct wafer probe contact. The carriages holding the tuning probes are moved at high speed along the slabline using linear electric actuators. The "S" shaped center conductor allows for a neutral, probe withdrawn, 50 Ohm state. A fast de-embedding calibration method allows speeding up the measurement procedure.

7 Claims, 12 Drawing Sheets

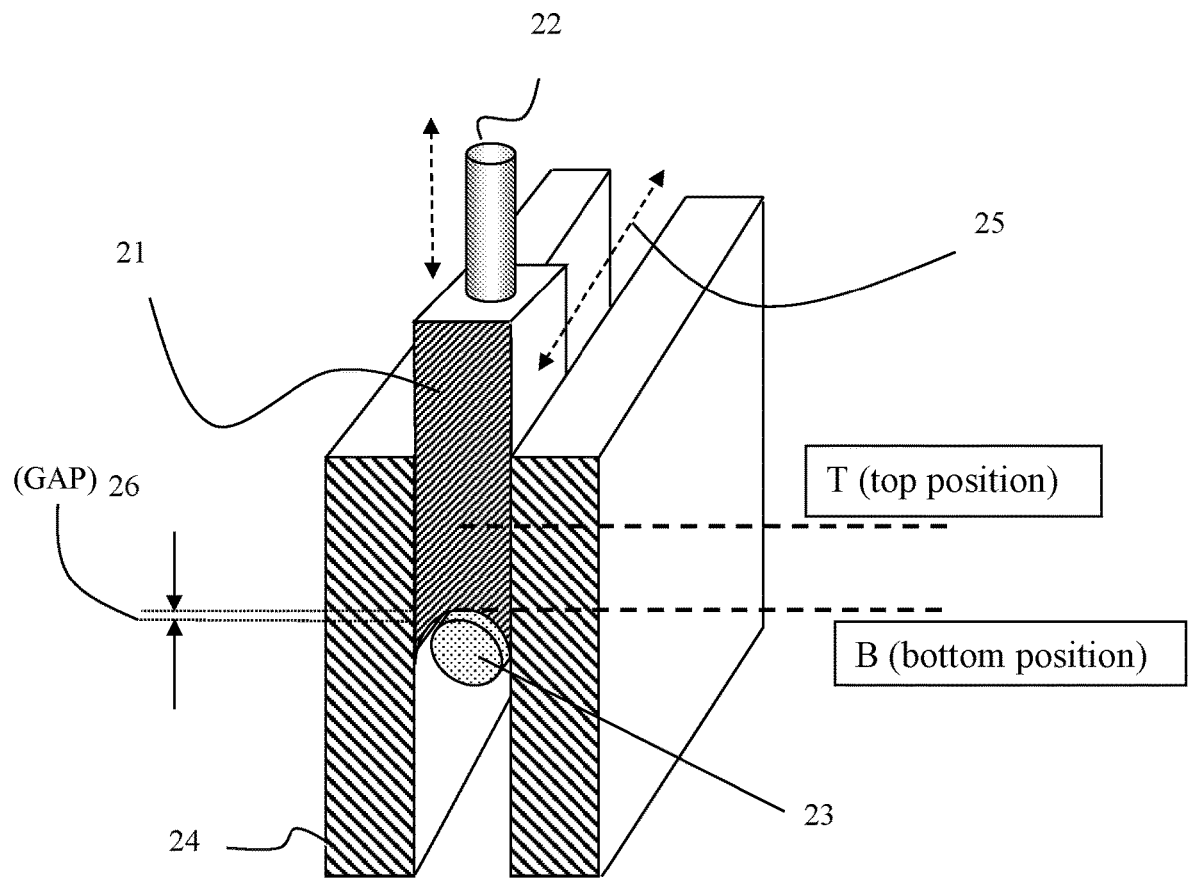
FIG.2: Prior art

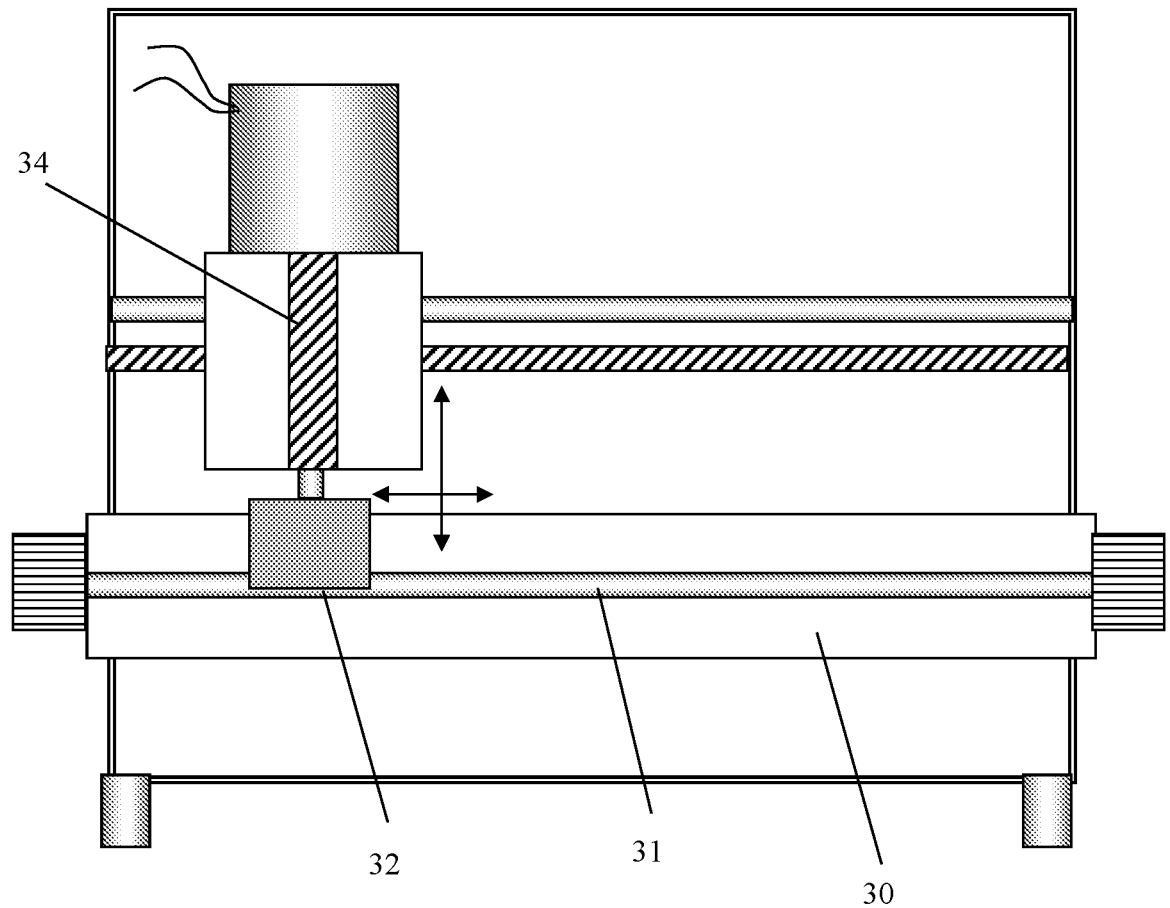
FIG. 3: Prior art

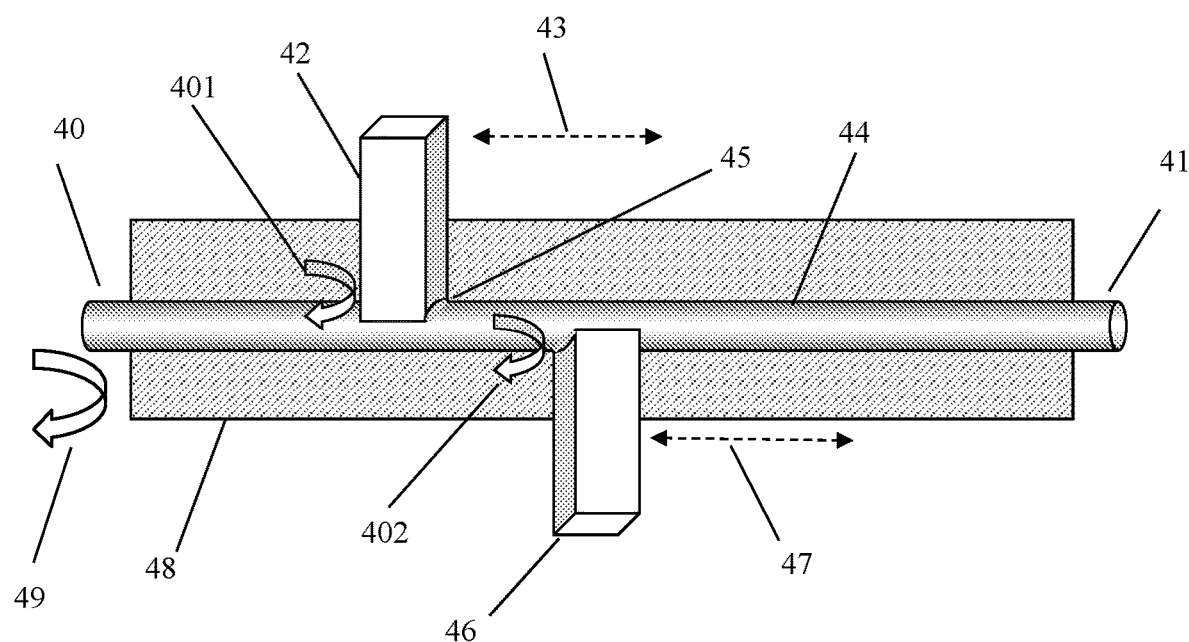
FIG. 4: Prior art

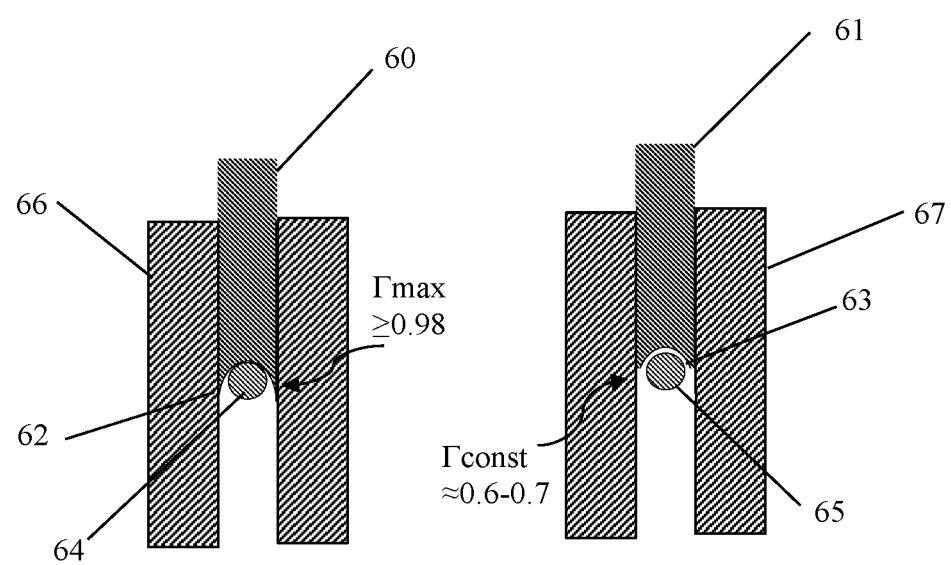
FIG. 6A: prior art        FIG. 6B

FIG.10: Prior art (ref. 11)

HARMONIC LOAD PULL TUNER

PRIORITY CLAIM

Not Applicable

CROSS-REFERENCE TO RELATED ARTICLES

1. "Load Pull Measurements" [online], Wikipedia [retrieved on Nov. 18, 2016] Retrieved from Internet <URL: http://en.wikipedia.org/wiki/Load_pull>
2. "Computer Controlled Microwave Tuner-CCMT", Product Note 41, Focus Microwaves January 1998.
3. Boulerne P., U.S. Pat. No. 7,595,709, Multiple-Carriage High Gamma Tuner", FIGS. 7 and 7' and Column 4 lines 63ff and column 5 lines 1-5.
4. Tsironis C., U.S. Pat. No. 6,674,293, "Adaptable Pre-Matched Tuner System and Method".
5. Tsironis C., U.S. Pat. No. 11,327,101, "Integrated Pre-matching module for Impedance tuner", FIG. 13.
6. "Linear Actuator" [online], Wikipedia [retrieved on Apr. 25, 2020] Retrieved from Internet <URL: https://en.wikipedia.org/wiki/Linear_actuator>
7. Tsironis C., U.S. Pat. No. 9,257,963, "Impedance Tuners with Rotating Probes", FIG. 15.
8. Tsironis C., U.S. Pat. No. 9,625,556, "Method for Calibration and Tuning with Impedance Tuners".
9. "Lecture 20: Transmission (ABCD) Matrix" [online], EE 481/581-Microwave Engineering, Course Syllabus [retrieved on Jul. 13, 2015] Retrieved from Internet <URL: http://whites.sdsmt.edu/classes/ee481/notes/481Lecture20>
10. Simpson, G. et al. U.S. Pat. No. 5,910,754, "Reduced height waveguide tuner for impedance matching", FIG. 8.
11. Tsironis, C. U.S. Pat. No. 8,854,162, "Method for preventing electrical short in impedance tuners using mechanical stop", FIGS. 5 and 8 to 14.

BACKGROUND OF THE INVENTION

This invention relates to RF load and source pull testing of medium and high-power RF transistors and amplifiers using remotely controlled electro-mechanical impedance tuners.

A popular method for testing and characterizing such microwave components (transistors) in the non-linear region of operation is "load pull" (see ref. 1). Load pull is an RF device measurement technique employing microwave impedance tuners (see ref. 2) and other microwave test equipment as shown in FIG. 1. The microwave tuners 2, 4 are used in order to manipulate the microwave impedance conditions under which the Device Under Test (DUT, or transistor, 3) is tested; the test signal is provided by a signal source 1 and the out-coming power is measured by a power meter 5; the whole is controlled by a PC controller 6, which has electronic interface to communicate with the instruments 1, 5 and the tuners 2, 4 using digital control and communication cables 7, 8 and 9.

DESCRIPTION OF PRIOR ART

Load-pull impedance tuners use, in general, a low loss transmission line 30 (parallel plate or slabline), FIG. 3, and one or more conductive tuning elements (tuning probes or slugs, 32 in FIG. 3 and the remaining of FIG. 2); the tuning probes 21 are attached to and controlled by complex adjustable high precision vertical axes 34 (see ref. 10) and are inserted into the slabline 24, approaching the center conductor 23, 31 and moved 25 along the axis of the slabline; this movement of the tuning probes creates capacitive coupling and a controllable variable reactance, allowing the synthesis of various impedances (or reflection factors) covering parts, up to the quasi totality, of the Smith chart (the polar impedance mapping display showing the normalized reflection factor area). The relation between reflection factor Γ and impedance Z is given by $\delta=(Z-Zo)/(Z+Zo)$, where $Z=R+jX$ and Zo is the characteristic impedance. A typical value used for Zo is 50 Ohm.

When parallelepiped metallic tuning probes (slugs) 21, FIG. 2, with a concave bottom, attached 22 to a vertical control mechanism (vertical axis) approach the center conductor 23, they capture and deform the electric field, which is stronger in the area between the center conductor and the ground planes of the slabline 24. This field deformation allows creating the high and controllable reflection factors. The main disadvantage of this embodiment is the requirement of high precision and resolution and, by consequence, tall and cumbersome vertical probe movement mechanisms 34 (see ref. 10), because most of the field capturing effect occurs when the probe is very close to the center conductor (FIG. 15 in ref. 7). This movement process slows down the tuning procedure for two reasons: (a) when the probe is away from the center conductor, the vertical probe movement is lengthy and much less effective, while the vertical moving speed is the same and (b) enhanced positioning accuracy and resolution is required all the way due to high tuning sensitivity in the high reflection area, when the probe is very close to the center conductor (FIG. 10).

Related prior art that teaches fixed penetration tuning probes also requires some kind of adjustable attenuation in front of the first tuning probe to mitigate the un-avoidable wideband high reflection, which risks creating spurious oscillations of the DUT, thus requiring, at least for the attenuator, some kind of vertical movement control. Neither relevant prior art ref. 3 or 4 teaches a tuner calibration method for overlapping tuning probes (ref. 3 does not teach calibration method at all and ref. 4 does not teach calibration method for alternatively swapping tuning sections in a shared transmission slabline structure); this overlapping structure, though, is essential and compatible with the proposed low profile, compact tuner size and high speed de-embedding tuner calibration and operation (see ref. 8).

BRIEF SUMMARY OF THE INVENTION

The invention claims a new slide screw load pull harmonic tuner type. The configuration, different from prior art, uses horizontal-only high-speed tuning probe movement techniques with wideband neutral (50 Ohm) tuning state and a preferred fast custom de-embedding calibration method. Once the tuner is properly calibrated, properly adapted prior art impedance synthesis (tuning) methods are applicable (see ref. 8).

The tuner itself uses a low loss slabline, arranged flat on the side (FIG. 8), to reach a very low profile; such low-profile tuners are needed for on-wafer integrations for avoiding a mechanical conflict with the microscope (see ref. 5). The tuning probes 82 and 83 are mounted using rolling ball bearings 84 or sliders on remotely controlled horizontally (along the slabline) moving carriages 85 and 86 and penetrate the channel between the slabline sidewalls 80 always at the same depth, or the same distance 89 to the center conductor 81, which corresponds to constant reflection amplitude and variable phase (because of the horizontal movement). This eliminates the need for an elaborate adjustable high precision vertical axis (see ref. 10).

The carriages are controlled either using high-resolution high-speed electric stepper actuators (see ref. 6) or stepper motors and ACME screws 87, 88, without additional sophisticated translation mechanisms (see ref. 6) thus also eliminating additional control gear. Last, but not least, the tuning mechanism, liberated from cumbersome and expensive high resolution vertical probe control and movement delays, benefits also from inherent lower tuning error sensitivity to mechanical probe positioning tolerances close to |Γ|≈1 (item 500 in FIG. 10 and FIG. 5 in ref. 11).

BRIEF DESCRIPTION OF THE SEVERAL VIEWS OF THE DRAWINGS

The invention and its mode of operation will be more clearly understood from the following detailed description when read with the appended drawings in which:

FIG. 2 depicts prior art, a perspective view of a vertically adjustable RF parallelepiped tuning probe (slug) and the relevant dimensions and parameters of the operation.

FIG. 3 depicts prior art, front view of a single-carriage single-probe slide screw load pull tuner.

FIG. 4 depicts prior art, the concept of a shared-slabline fixed-penetration two-probe tuner without neutral state (50 Ohm) wideband capability.

In FIG. 5A the probes #1 to #4 in dashed frame signify their "withdrawn" status; in FIG. 5B the probes #1 to #4 are positioned in their "initialization" status.

FIGS. 6A through 6B depict the basic difference between the crossing over and the prior art tuning probes: FIG. 6A depicts the prior art structure, FIG. 6B depicts the crossing over structure.

DETAILED DESCRIPTION OF THE INVENTION

Figure 1:
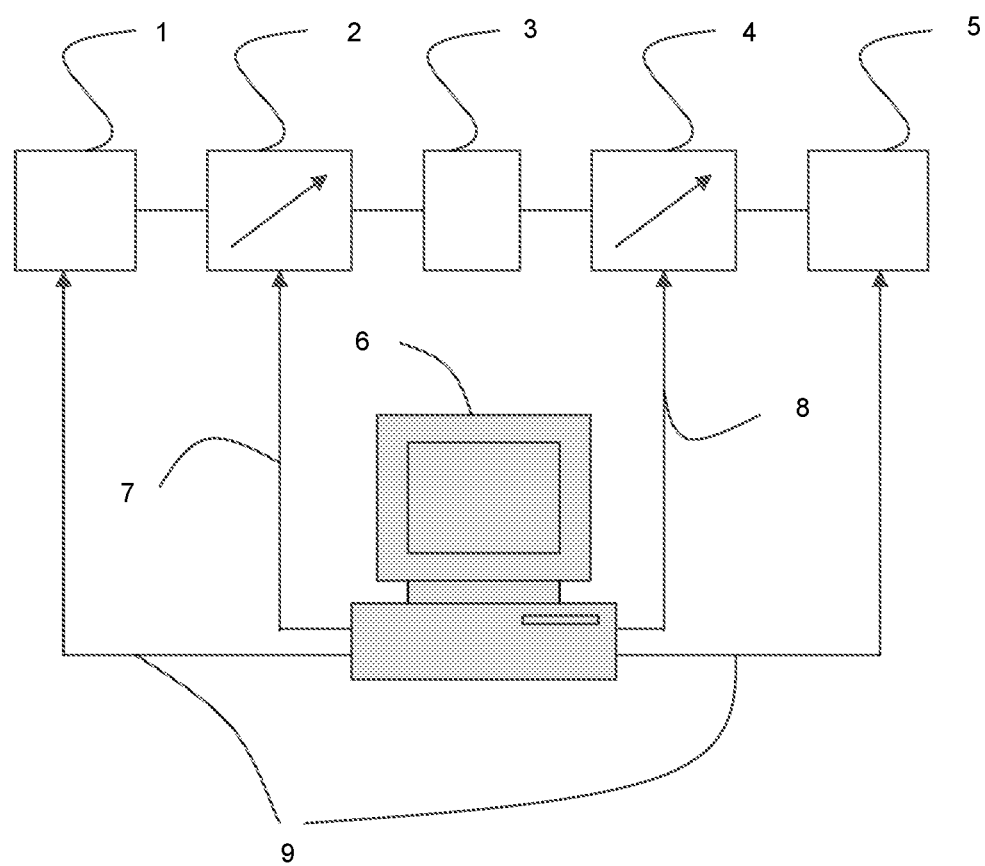
FIG. 1 depicts prior art, a typical automated load pull test system.
Figure 5A:
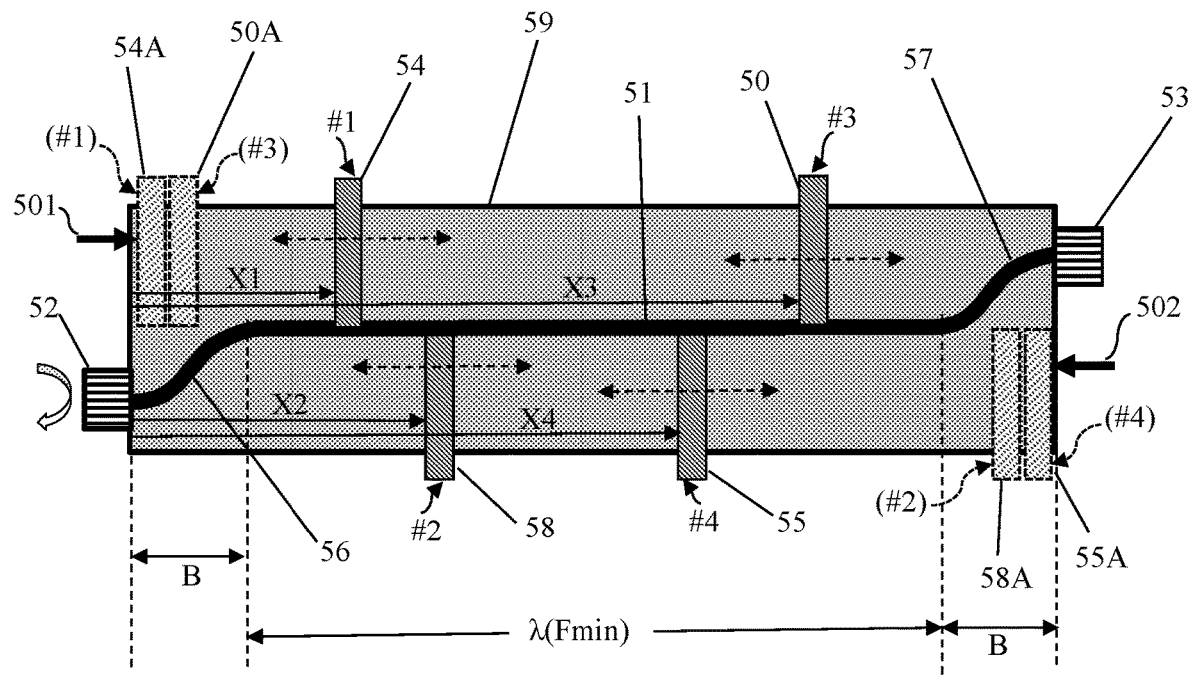
FIGS. 5A through 5B depict detailed front view of the shared-slabline fixed-penetration four-probe harmonic tuner with neutral state (50 Ohm) wideband capability.
Figure 5B:
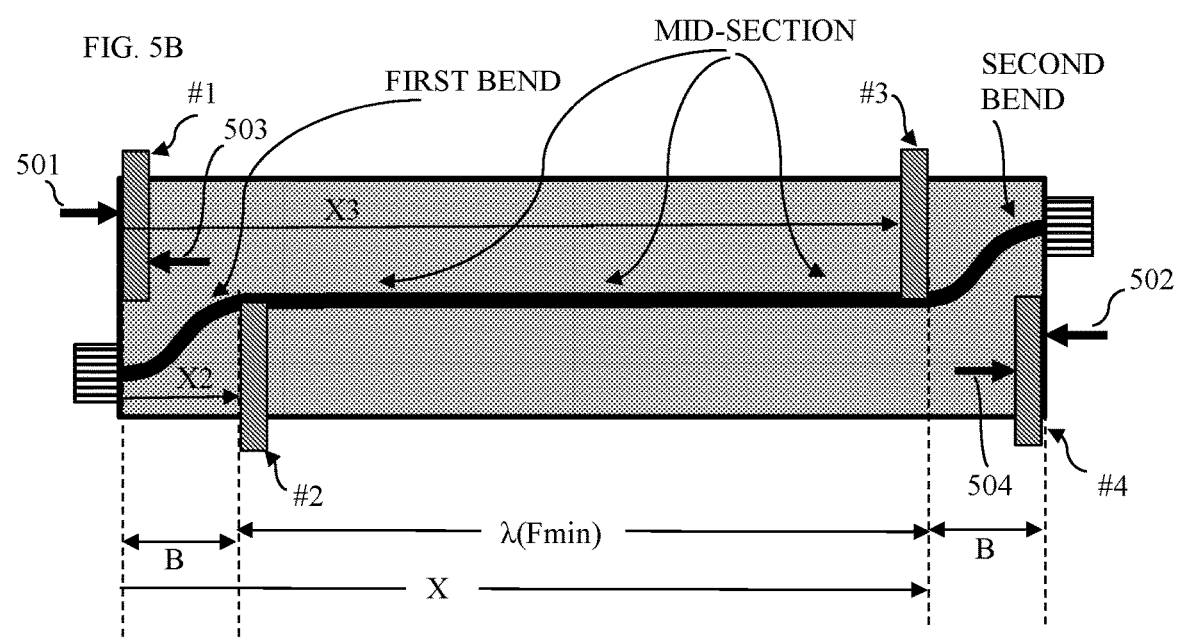
Figure 8:
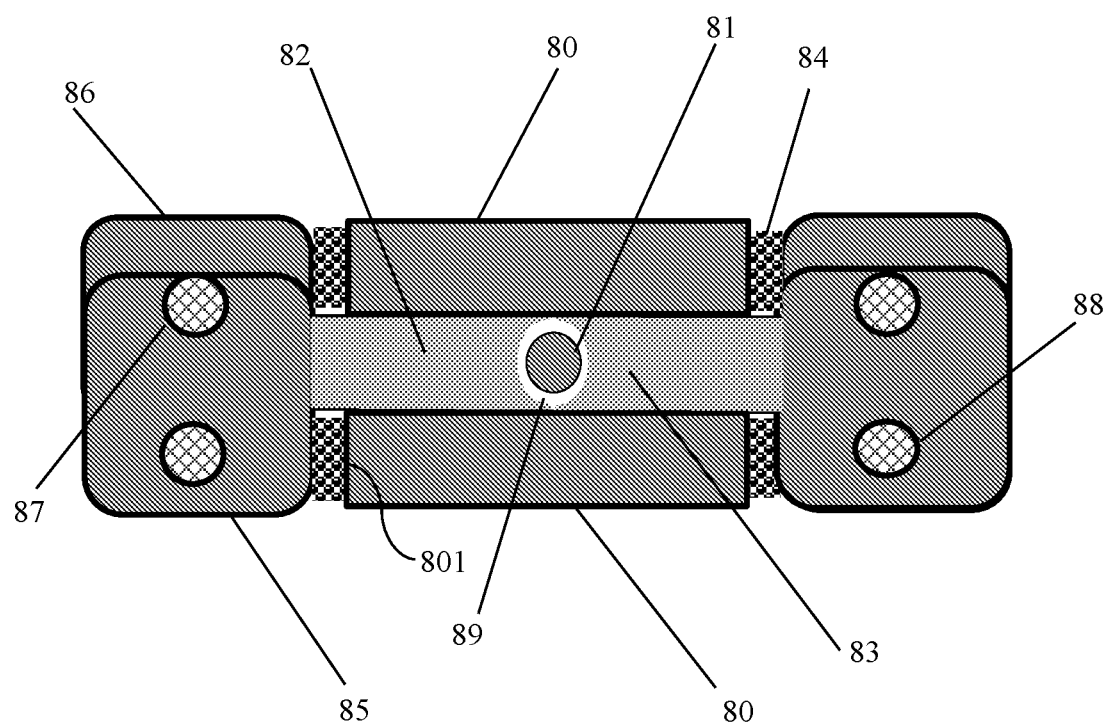
FIG. 8 depicts a cross section of the shared-slabline fixed-penetration four-probe tuner.
Figure 9:
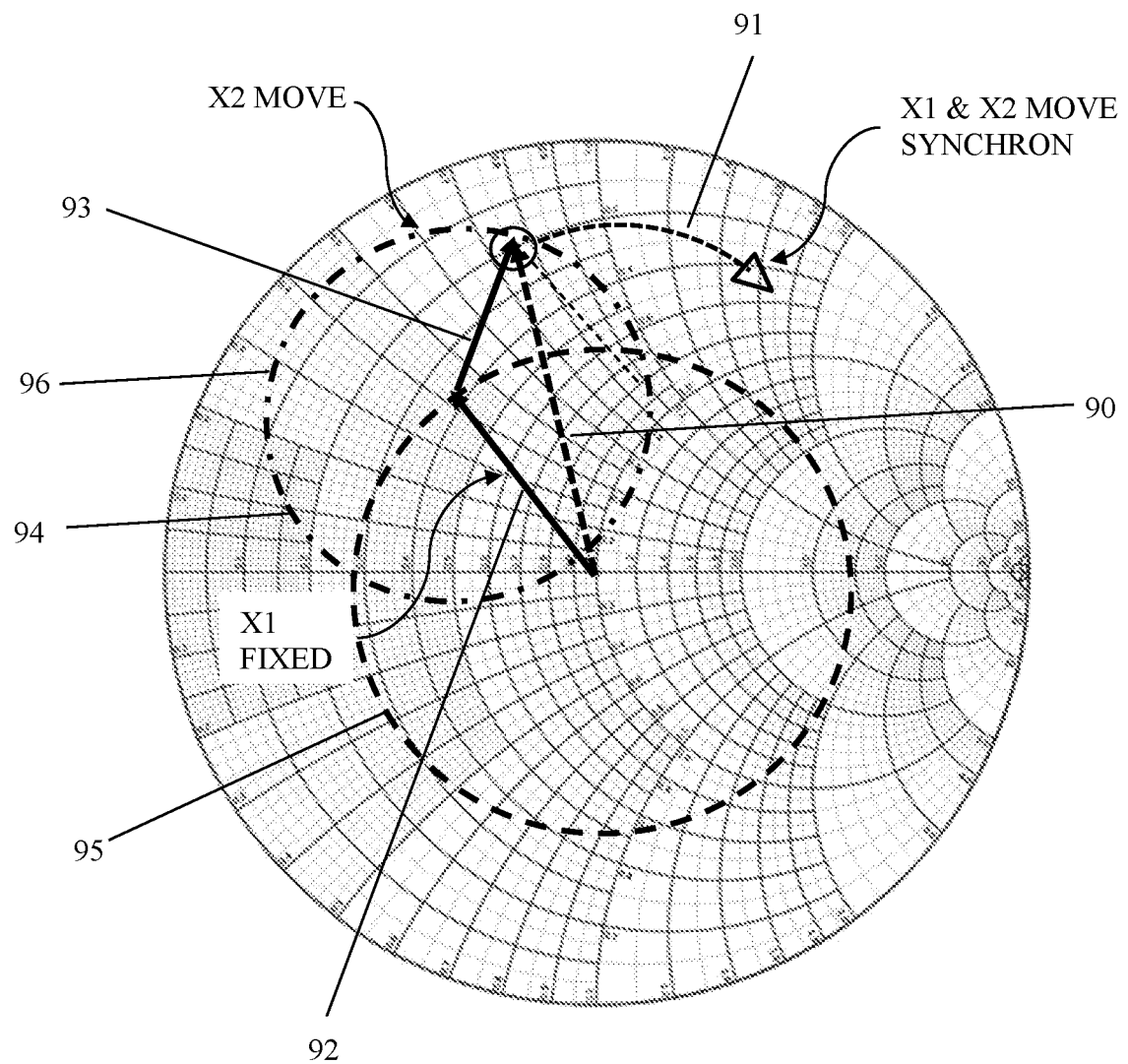
FIG. 9 depicts the tuning mechanism of two probes of the shared-slabline fixed-penetration four-probe harmonic tuner.

This invention discloses a radio frequency (RF, microwave), computer-controlled harmonic impedance tuner and the associated calibration method, suitable for load pull measurements. The tuner (FIGS. 5, 7 and 8) uses a low loss transmission airline (slabline) 59, which includes two parallel conducting (metallic or metallized) sidewalls 80 (FIG. 8) forming a straight channel and a, typically but not exclusively, cylindrical center conductor 51, 81. The center conductor is "S" shaped and terminates at the two ends of the slabline, the input or test port 52 facing the DUT, and the output or idle port 53 facing the load. Four parallelepiped tuning probes 50, 54, 58 and 55 (see also FIG. 2) are inserted in pairs opposite (diametrically) to each-other from the top and the bottom (FIG. 8) into the slabline channel, are kept at fixed depth 26 (FIG. 2) and can be moved only horizontally 43, 47 (FIG. 4, showing a two-probe case) along the slabline; each probe creates, as it moves, at its own reference plane concentric reflection factor circles 92 on the Smith chart (FIG. 9). The total reflection factor 90 is created by a planetary epicycloid superposition of the two reflection factor vectors (one circle rotates around a point at the periphery of the other) and can be seen in FIG. 9 (see ref. 4, FIG. 8*b*). Four tuning probes create a more complicated double epicycloid trace.

The simpler concept of a two-probe slide screw tuner with vertically fixed tuning probes is explained in prior art FIG. 4. The two slugs 42 and 46 move inside the channel of the slabline 48 along 43 without changing their penetration or at constant distance 45 from the center conductor 44. The reflection factor 49 at the input, or test, port 40 is created by vector superposition of the individual reflections 401 and 402 of each probe (slug). Port 41 is idle and connected to auxiliary instruments. The input (test) port 40 is connected to the DUT. The shortcoming of this configuration is that the reflection is present at all but a number of tuner settings, that is only when the two vectors 401 and 402 arrive opposite at the test port and cancel each other; this also means that a 50 Ohm impedance can only be generated (tuned to) individually at a frequency by properly positioning the slugs. The, otherwise, always present reflection creates risk of spurious oscillations of the DUT and, either its catastrophic failure or, at least, wrong data. This invention solves this problem by bending the center conductor and allowing wideband 50 Ohm behavior.

FIGS. 6A and 6B depict the difference between the traditional tuning probe (FIG. 6A) and the new tuning probe (FIG. 6B) used in the new tuner type: in the case of the traditional probe (FIG. 6A) the slug 60 has protrusions (wings) 62 extending beyond the center of the center conductor 64 of the slabline 66; this is in order to capture a maximum of the stray electric field towards the bottom of the slabline and create a maximum reflection factor (at the probe reference plane) close to 1. On the other hand, the slugs 61 of the new tuner have their protrusions 63 chopped slightly above the center of the center conductor 65 of the slabline 67, to allow crossing over the slug on the other side of the slabline channel (slugs 82 and 83 in FIG. 8). This shortening of the enveloping of the center conductor, together with the larger gap between slug 61 and center conductor 65 creates smaller reflection factor of the order of 0.6 to 0.7, which is sufficient for this type of tuner, as shown in FIG. 9.

The concept of the harmonic four probe tuner without vertical probe control is shown in FIG. 5: the tuning probes are mounted diametrically in pairs across the channel of the slabline 59, which has a length of the straight section 51 of the center conductor of one wavelength λ(Fmin) at the lowest frequency of operation of the tuner; the body of the slabline 59 itself, between the test (or input) port 52 and the idle (or output) port 53 is longer by two times the span of the bends B. Tuning probes #1, 54 and #3, 50 are mounted on one side of the slabline channel, the other two probes #2, 58 and #4, 55 are mounted on the diametrically opposite side. Probes #1 and #3 are withdrawn close to the test port, shown as 54A and 50A and probes #2 and #4 are withdrawn close to the idle port 53, shown as 58A and 55A; the positions X1 to X4 of the probes #1 to #4 are defined from the test port 52 reference line, as shown clearly in FIG. 5; it is obvious that the carriages holding probes #1 and #4 are positioned in withdrawal state next to the edges of the slabline using proximity limit switches 501 and 502 mounted on the slabline end walls and probes #3 and #2 using proximity limit switches 503 and 504 mounted on the adjacent carriages holding probes #1 and #4. It is also obvious that X1 cannot be larger than X3 and X2 larger than X4. Otherwise, all opposite probes (#1 with #2 and #4, and #2 with #1 and #3 etc.) can cross-over and this must be considered in the calibration algorithm. In any case the shape of the bends of the center conductor relative to the width of the probes when withdrawn is chosen such that the capacitive coupling between the probes and the center conductor is negligible to avoid a residual reflection; on the other hand, the bends 56 and 57 do not change the characteristic impedance of the slabline, as long as the center conductor keeps its diameter and remains centered between the sidewalls of the slabline.

Figure 7:
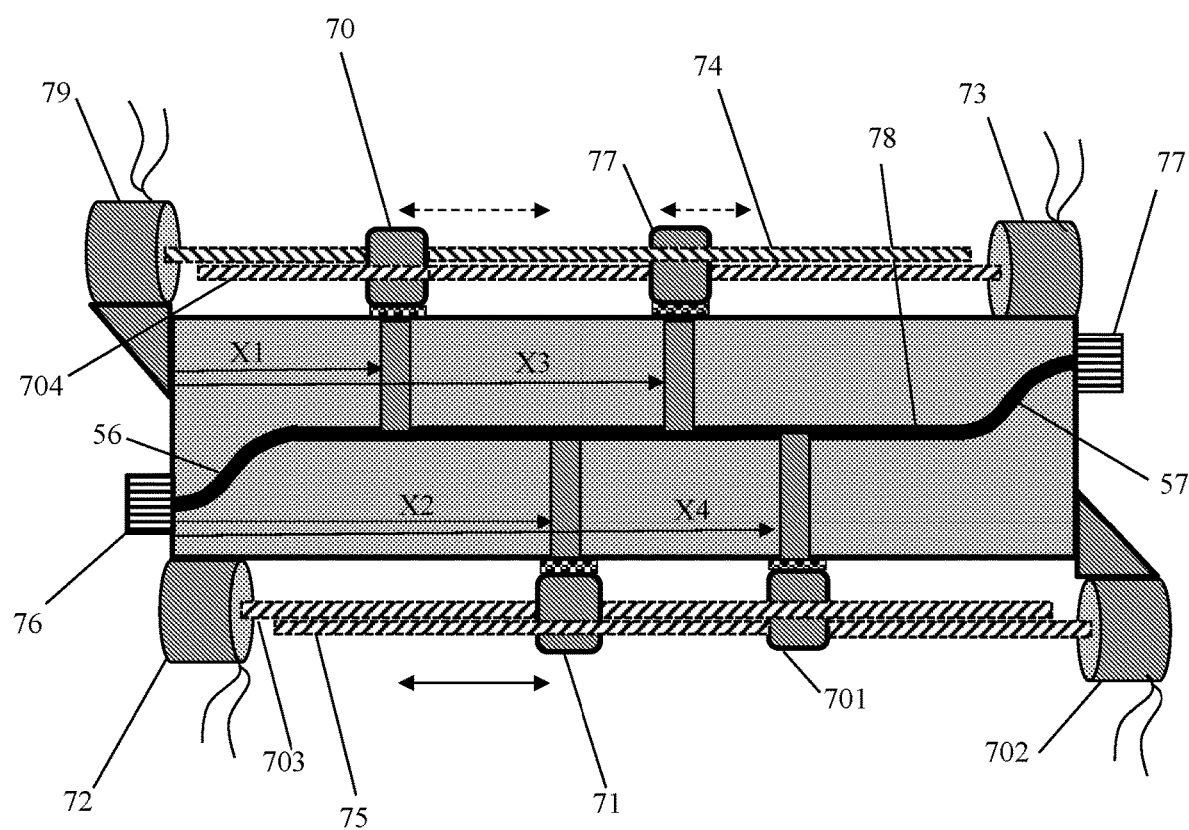
FIG. 7 depicts front view of the mechanical concept of shared-slabline fixed-penetration four-probe harmonic tuner with neutral withdrawal capability.
Figure 10:
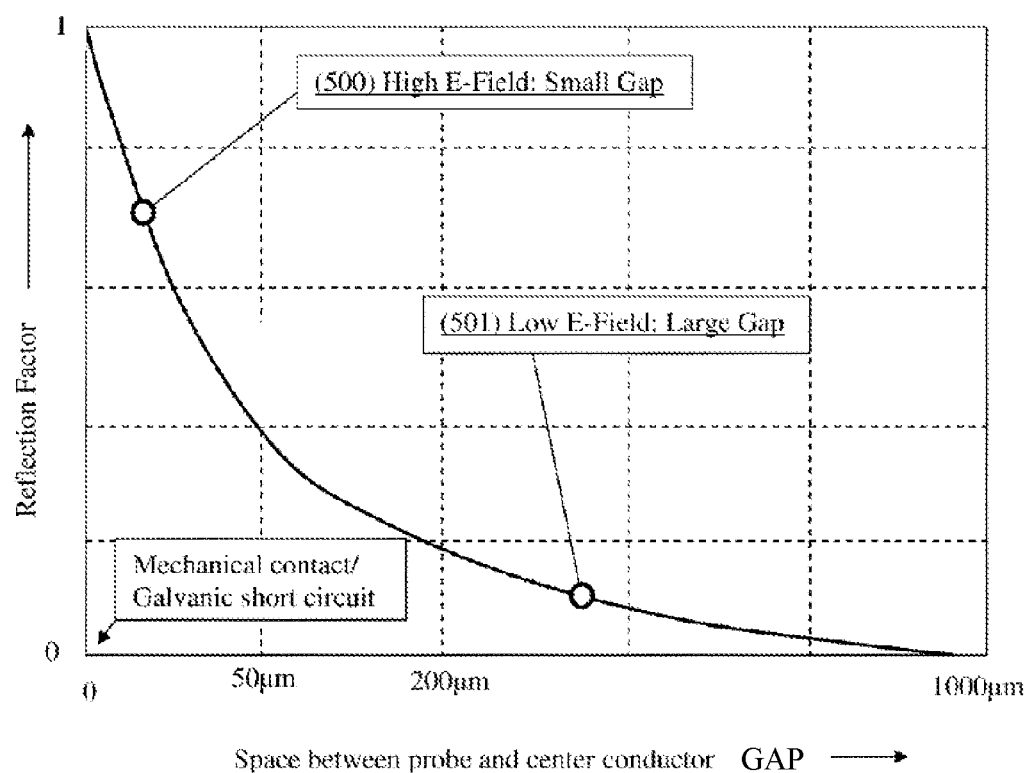
FIG. 10 depicts prior art, the dependence of magnitude and increasing sensitivity of the reflection factor on the proximity of the tuning slug to the center conductor.

The four-probe tuner with neutral initialization state is shown in FIG. 7: it includes an input (test) port 76 and an output (idle) port 77; the horizontal control of the carriages 70, 71, 77 and 701 (FIG. 7) is best accomplished using linear electric actuators (see ref. 6) or stepper motors 72, 73, 79 and 702 and associated horizontal ACME rods 703, 704, 74, 75. Since the tuner does not have adjustable vertical axes, not being able to withdraw the tuning probes from the slabline, to create a reflection-free neutral state, means that another way is needed: this is made possible by bending 56, 57 the center conductor close to the coaxial connectors of the tuner ports into a stretched "S" shape. This then allows to move the tuning probes to the neutral positions 50A, 55A and 54A, 58A and 55A, where the capacitive coupling with the center conductor 51 vanishes and so does the residual reflection factor. The center conductor is bent in the plan of the channel of the slabline staying always at the same distance from the sidewalls 80 (FIG. 8); since the characteristic impedance, even at differential ΔX level, is defined by the ratio of the channel width and the center conductor diameter, as long as the bending shape is smooth enough and the electro-magnetic field is not overly deviating from the predominant coaxial TEM propagation mode, the transmission and residual reflection perturbation is negligible (item 501 in FIG. 10) and, at least, below the threshold needed for a tuner slabline (a tuner works by creating reflection, perfect 50 Ohm matching is not a strict requirement).

The center conductor 78 is bent (twisted) at both ends 56, 57 terminating with coaxial connectors. The tuning probes are attached to carriages 70, 77, 71 and 701, which slide or roll 84 on the edges 801 of the sidewalls 80 (FIG. 8) along the slabline. In this embodiment the carriages are threaded and driven by ACME screws 74, 704, 75 and 703 controlled by remotely controlled stepper motors 79, 73, 702, and 72 correspondingly. In real operation, since the horizontal coordinates X1 to X4 are measured from the input (test) port 76 reference plan, then withdrawal of probes #2 and #4 occurs at bend 57 and of probes #1 and #3 at bend 56. The span B of the bends (FIG. 5) depends on the mechanical layout and is such that, when the probe is in the extreme outside position, the coupling with the center conductor is insignificant; typically, the required gap between the bottom of the tuning probes and the center conductor is no more than 2 times the center conductor diameter. The withdrawal positions are detected using limit switches.

As already mentioned, the interaction of four tuning probes creates multiple reflections and seems chaotic, thus impossible, and not intuitive to visualize graphically. In FIG. 9, though, there is an attempt to visualize the reflection factor generation when two out of four probes interact in the active straight section of the "S" shaped center conductor. Assuming probe #1 is at position X1, closer to the test port than probe #2 and generates a (fixed) vector 92; probe #2 creates a superimposed vector 93 which rotates around the tip of vector 92, following the trajectory 94, creates a total vector 90. Both vectors rotate as the probes move as shown by the dotted circles 95 and 96. If only probe #2 moves, then the total vector 90 follows trace 96; when both probes move together at the same pace, then the total vector 90 follows trace 91 and if they both move at different paces it follows a Lissajous contour. In the case of four independently moving probes the traces are simply the superposition of such epicycloid traces. What seems too complex to visualize, is though handlebar using numerical data processing, as shown in ref. 8.

Cascading two two-probe tuners (FIG. 5) creates enough combined tuner settings to generate solutions for two-frequency or harmonic tuning; this means the four-probe tuner of FIG. 5 can synthesize random impedances independently at two harmonic frequencies; a condition is that all tuning probes create enough reflection factor at both harmonic frequencies. Other than harmonic tuners with vertical probe control, where two probes are enough to control two frequencies, in our case four probes are required; logically it comes down to degrees of freedom versus targets: two impedances include four values Real and Imaginary or amplitude and phase times two. The difference with prior art two-probe harmonic tuners (see ref. 4) is that here the probes are not always cascaded in the same order; the calibration must account for that as is going to be disclosed further down.

The tuner can be calibrated and operated to create user-defined impedances. We distinguish two special states: the initialization state (FIG. 5B), used in calibration, and the withdrawn state (FIG. 5A) used in operation. In the withdrawn state the tuner presents to the DUT a wideband 50 Ohm load, that minimizes the risk of spurious DUT oscillations. However, free control of all probes along the entire length of the slabline requires probe #3 not to conflict with probe #1 and probe #2 not to conflict with probe #4. Therefore probes #3 and #2 are initialized by moving them along the slabline one wavelength A out of the way of probes #1 and #4 correspondingly, which in both cases amounts to X2=B (for probe #2) and X3=λ+B for probe #3; this is the initialization state.

Figure 11:
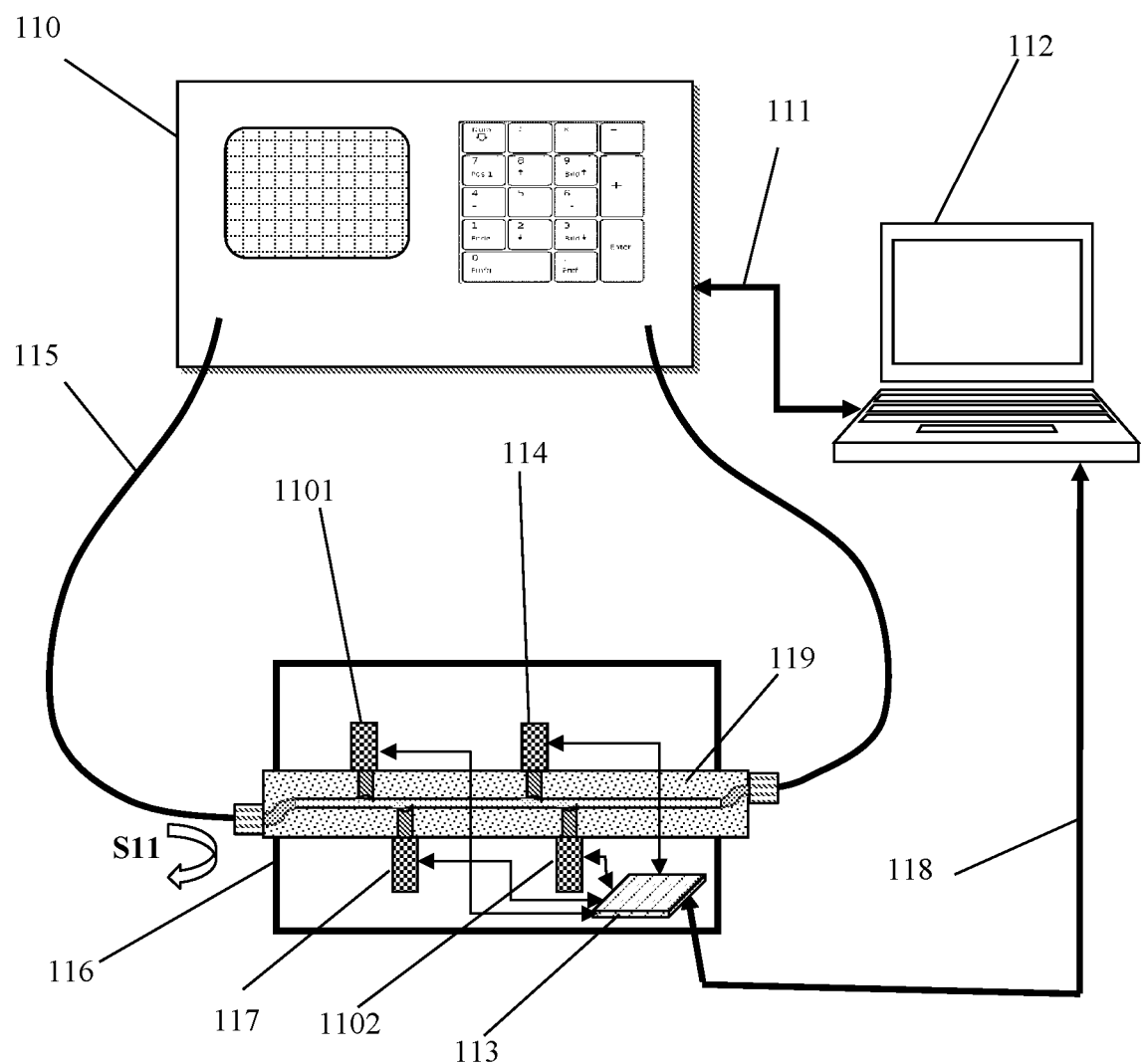
FIG. 11 depicts a calibration setup of the tuner.
Figure 12:
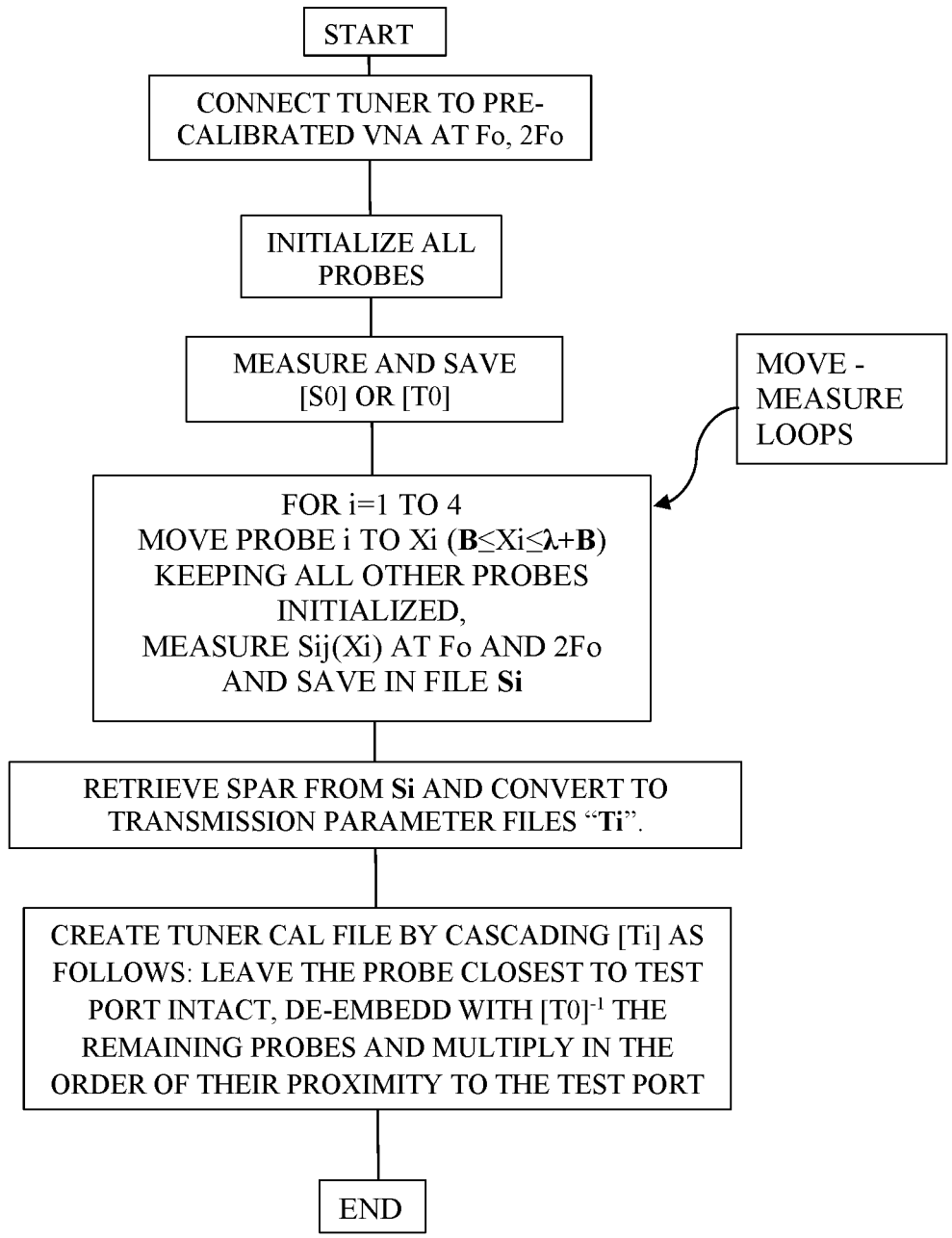
FIG. 12 depicts the flowchart of the de-embedding calibration algorithm of the shared-slabline fixed-penetration four-probe harmonic tuner.

The tuner calibration process uses a setup as in FIG. 11 and is depicted, step by step, in the flowchart of FIG. 12: each tuning probe shall be able to move over one half of a wavelength at the fundamental operation frequency, which means that two cascaded probes need a total travel of λ, divided in several, typically, 100 incremental steps and, whereas this corresponds to 3.6° per step transmission phase at Fo, at the harmonic frequency 2Fo this corresponds to 7.2° per step. This coarser resolution is, though, countered by the movement of the probe over 720° (since $\lambda(Fo)/2=\lambda(2Fo)$); In the calibration setup the tuner 116 is connected using RF cables 115 with a Vector Network Analyzer (VNA) 110 pre-calibrated at the frequencies of interest. The linear actuators 1101, 1102, 114 and 117 (see ref. 6) are controlled by the control computer 112 using a digital cable 118 via the electronic on board control module 113 to move the carriages, attached to the actuators, which slide along the axis of the slabline 119, in order to control the reflection factor S11, while reading the four scattering parameters (s-parameters) from the VNA 110 using standard, digital communication cable 111 and a prior art communication protocol. Computer 112 includes a temporary RAM and a permanent (hard-disc) electronic memory for saving large amount of data containing probe positions and the associated s-parameters in calibration data files for later use. The PC controller 112 also includes and runs appropriate tuner and VNA control and communication software as well as appropriate numerical data processing (s-parameter matrix conversion to T (cascade) format, matrix inversion and multiplication and cascading) routines (see ref. 9).

The fast de-embedding calibration procedure comprises the following steps (FIG. 12): After the tuner is connected to the VNA, pre-calibrated at a selected frequency Fo and the harmonic frequency 2Fo inside the operation range of all probes of the tuner, the tuning probes are initialized as follows: probe #1 is moved to position 54A, probe #3 is moved to position X3=B+λ(Fo), probe #4 is moved to position 55A equal to X4=λ+B and probe #2 is moved to position X2=B; S-parameters of the tuner are measured and saved in a init matrix [S0]. Then the third tuning probe #3 is moved along the slabline to a multitude M of approximately 100 positions X3 between the initialization position (X3.0=B+λ(Fo)) and X3=B at the selected frequency Fo and s-parameters are measured at Fo and 2Fo and saved, together with the position X3 in a first data file S3. Subsequently the tuning probe #3 is moved to position X3.0=λ+B and tuning probe #2 is moved from the init position 54A in a multitude of M positions X2 and at every step s-parameters at Fo and 2Fo are measured and saved in a second data file S2 together with the position X2.

The same procedure is repeated with probes #2 and #4 after probes #1 and #3 are initialized to positions X1=B and X3=λ+B; first probe #4 is moved to X4=λ+B and probe #2 is moved from X2=B to X2=λ+B in M=100 steps, s-parameters are measured and saved in a file S2; then probe #2 is moved to X2=B and probe #4 is moved from X4=2+B to X4=B in M=100 steps and s-parameters are measured and saved in file S4. At this point we have created four data files S1 to S4 containing sets of s-parameters associated with probe coordinates X1 to X4, then we have the following possible probe position arrangements: 1) X1<X2 and X2<X3 and X4<X3; 2) X1<X2 and X2<X3 and X3<X4; 3) X1<X2 and X3<X2 and X3<X4; 4) X2<X1 and X1<X4 and X4<X3; 5) X2<X1 and X3<X2 and X1<X4; 6) X2<X1 and X1<X4 and X3<X4. Assuming s-parameters in file Si are declared [Si] with the associated cascade ABCD format [Ti], then, in a de-embedding procedure, matrices are de-embedded and cascaded as follows: The first matrix [T1] or [T2] remains intact, if the associated probe is closest to the input port (X1<X2 or X2<X1); the remaining matrices [Ti] (including [T2] or [T1]) are multiplied with the inverse matrix [T0]$^{-1}$ in the order of the signal flow: i.e., if Xi<Xj then multiply [Ti]*[Tj] in this order, because the instant position of the probes defines the order of the cascaded twoports and yields the tuner calibration matrix as follows: [TC]=[Ti]* [T0]$^{-1}$*([Tj]*[Tk]*[Tm]), wherein i, j, k, m are values between 1 and 4 per the previous rules. Or if Xi<Xj<Xm<Xk multiply [Ti]*[Tj]*[Tm]*[Tk], etc., If Xi=Xj, i.e., if the tuning probes face each-other across the channel, the multiplication order is irrelevant, This procedure creates the actual tuner calibration file containing s-parameters Sij(X1,X2,X3,X4,Fo) and Sij(X1, X2,X3,X4,2Fo) for a total of (in case of M=100 steps) $2*100^4=2*10^8$ sets of four s-parameters per 4 bytes pro value or ~6.4 GB of data, to be processed in RAM. A direct calibration is impossible. The de-embedding calibration only requires measurement of 400 points at 2 frequencies for a total of approximately 7-8 minutes plus probe movement or a total of less than 15 minutes. Using the calibration data for harmonic impedance synthesis (tuning) purpose requires algorithms based on numerical data crunching equivalent to the algorithms used in ref. 8.

Obvious alternatives to the disclosed concept of a low-profile load pull tuner with four independent fixed-insertion, diametrically mounted and sharing the same slabline, tuning probes with neutral state capability but without adjustable vertical axis, using a double-bent center conductor, shall not impede on to the validity of the present invention.

What is claimed is:

1. A harmonic load-pull tuner comprising:
a low loss slotted airline, wherein the low loss slotted airline is a having an input port, an output port, two sidewalls forming a channel, an "S" shaped center conductor, and four remotely controlled mobile carriages #1, #2, #3 and #4, saddled in pairs facing each-other on the two sidewalls across the channel, each of said four remotely controlled mobile carriages holding a metallic tuning probe #1, a metallic tuning probe #2, a metallic tuning probe #3, and a metallic tuning probe #4 respectively, which its keep inserted into the channel at fixed penetration and move along the slabline to a position at a distance X from the input port,
wherein the metallic tuning probes are capacitively coupled with the "S" shaped center conductor, and
wherein carriage #1 holds metallic tuning probe #1, carriage #2 holds metallic tuning probe #2, carriage #3 holds metallic tuning probe #3 and carriage #4 holds metallic tuning probe #4, and
wherein the "S" shaped center conductor has a straight mid-section between two end bends which are terminated with coaxial connectors, a first bend at the input port and a second bend at the output port, each said bend having a span B, said "S" shaped center conductor residing in its entire length, including the straight mid-section and the bends, at equal distance between the two sidewalls of the slabline; and
wherein the metallic tuning probes #1 and #3 are inserted from one side of the two sidewalls and the metallic tuning probes #2 and #4 are inserted from the other side of the two sidewalls diametrically into the channel and held at fixed distances from the straight mid-section of the "S" shaped center conductor, sharing the slabline; and
wherein metallic tuning probe #2 can cross over metallic tuning probes #1 and #3 and metallic tuning probe #4 can also cross over metallic tuning probes #1 and #3; and
wherein carriage #1 moves the metallic tuning probe #1 to position X1, carriage #2 moves the metallic tuning probe #2 to position X2, carriage #3 moves the metallic tuning probe #3 to position X3 and carriage #4 moves the metallic tuning probe #4 to position X4.

2. The harmonic load-pull tuner of claim 1, wherein the straight mid-section of the "S" shaped center conductor is at least one wavelength (k) long at a minimum frequency of operation of the harmonic load-pull tuner.

3. The harmonic load-pull tuner of claim 1, wherein the four remotely controlled mobile carriages slide along the slabline between the input port and the output port remotely controlled by stepper motors, drive screws and gear and their positions are reset using proximity limit switches.

4. The harmonic load-pull tuner of claim 1, wherein the metallic tuning probes are withdrawn, capacitively de-coupled from the center conductor by moving them within span of the bends close to the input or output ports, and in particular by placing metallic tuning probe #1 adjacent to the input port within the span of the first bend and metallic tuning probe #4 adjacent to the output port within the span of the second bend, and by placing metallic tuning probe #3 adjacent to metallic tuning probe #1 within the span of the first bend and metallic tuning probe #2 adjacent to metallic tuning probe #4 within the span of the second bend.

5. The harmonic load-pull tuner of claim 1, wherein the metallic tuning probes are initialized as follows: metallic tuning probe #1 is moved within the span of the first bend, metallic tuning probe #4 is moved within the span of the second bend, metallic tuning probe #2 is moved to position X2=B, and metallic tuning probe #3 is moved to position X3=$\lambda$+B.

6. The harmonic load-pull tuner of claim 4, wherein the metallic tuning probes, when not withdrawn, are capacitively coupled with the "S" shaped center conductor.

7. A calibration method for the harmonic load-pull tuner of claim 5, comprising the following steps:
  a) connect the harmonic load-pull tuner to a vector network analyzer, pre-calibrated at frequencies Fo and 2Fo;
  b) initialize all metallic tuning probes;
  c) measure s-parameters at Fo and 2Fo and save in an init matrix [SO];
  d) in a tuning probe movement and s-parameter measurement loop: move the metallic tuning probe #1 to a multitude M of positions X1 with X1 larger or equal to B and smaller or equal to X(Fo)+B, measure s-parameters Sij at Fo and 2Fo with $\{i, j\}=\{1,2\}$ and save (X1, Sij) in a file S1;
  e) initialize the metallic tuning probe #1;
  f) in a tuning probe movement and s-parameter measurement loop: move the metallic tuning probe #2 to multitude M of positions X2 with X2 larger or equal to B and smaller or equal to $\lambda$(Fo)+B, measure s-parameters Sij at Fo and 2Fo with $\{i, j\}=\{1,2\}$ and save (X2, Sij) in a file S2;
  g) initialize the metallic tuning probe #2;
  h) in the tuning probe movement and s-parameter measurement loop: move the metallic tuning probe #3 to the multitude M of positions X3 with X3 larger or equal to B and smaller or equal to $\lambda$(Fo)+B, measure s-parameters Sij at Fo and 2Fo with $\{i, j\}=\{1,2\}$ and save (X3, Sij) in a file S3;
  i) initialize the metallic tuning probe #3;
  j) in the tuning probe movement and s-parameter measurement loop: move the metallic tuning probe #4 to the multitude M of positions X4 with X4 larger or equal to B and smaller or equal to $\lambda$(Fo)+B, measure s-parameters Sij at Fo and 2Fo with $\{i, j\}=\{1,2\}$ and save (X4, Sij) in a file S4;
  k) retrieve s-parameter and tuning probe position data from files S1 to S4; if (X1<X2) then cascade the invers s-parameter init matrix [SO]$^{-1}$ with the s-parameters of files S2 to S4 and replace in files S2 to S4; cascade the s-parameters of file S1 with the parameters of files S2 to S4 in the order of increasing X coordinate, else if (X1>X2) then cascade the invers s-parameter init matrix [SO]$^{-1}$ with the s-parameters of files S1, S3 and S4 and replace in files S1, S3 and S4; cascade the s-parameters of file S2 with the parameters of files S1, S3, S4 in the order of increasing X coordinate, and
  l) save in tuner calibration file as (X1, X2, X3, X4, Sij, Fo) and (X1, X2, X3, X4, Sij, 2Fo);
  m) terminate.

* * * * *